United States Patent
Shih

(10) Patent No.: US 8,291,565 B2
(45) Date of Patent: Oct. 23, 2012

(54) METHOD OF REFURBISHING BIPOLAR ELECTROSTATIC CHUCK

(75) Inventor: Hong Shih, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 987 days.

(21) Appl. No.: 12/248,987

(22) Filed: Oct. 10, 2008

(65) Prior Publication Data

US 2010/0088872 A1 Apr. 15, 2010

(51) Int. Cl.
*B23P 6/00* (2006.01)
(52) U.S. Cl. ............... 29/402.18; 29/402.01; 29/402.02; 29/846; 29/593
(58) Field of Classification Search ............... 29/402.01, 29/402.02, 402.08, 402.18, 407.01, 407.05, 29/846, 593
See application file for complete search history.

(56) References Cited

U.S. PATENT DOCUMENTS

| | | | |
|---|---|---|---|
| 2003/0033116 A1* | 2/2003 | Brcka et al. | 702/182 |
| 2008/0092806 A1* | 4/2008 | West et al. | 118/70 |
| 2009/0034148 A1* | 2/2009 | Lubomirsky et al. | 361/234 |

FOREIGN PATENT DOCUMENTS

JP 2008028052 A * 2/2008
* cited by examiner

*Primary Examiner* — Derris Banks
*Assistant Examiner* — Azm Parvez

(57) ABSTRACT

A bipolar electrostatic chuck refurbishing process in accordance with an aspect of the present invention does not require physical separation of the two electrodes of the electrostatic chuck. One aspect of the present invention is drawn to method of treating a bipolar electrostatic chuck having a front surface and a back surface and comprising a first electrode disposed at the front surface, a second electrode at the front surface and an anodized layer disposed on the front surface, the first electrode and the second electrode. The method comprises measuring a first parameter of the electrostatic chuck, discarding the electrostatic chuck if the first measured parameter is not within a first predetermined range, cleaning the electrostatic chuck if the first measured parameter is within the first predetermined range, sealing gaps between the first electrode and the second electrode at the front surface with a sealant, without displacing the first electrode relative to the second electrode, eliminating the anodized layer, and disposing a new anodized layer onto the front surface, the first electrode and the second electrode.

19 Claims, 8 Drawing Sheets

METHOD OF REFURBISHING BIPOLAR ELECTROSTATIC CHUCK

BACKGROUND

Bipolar electrostatic chucks are commonly used in semiconductor wafer fabrication. These chucks use electrostatic forces to hold a semiconductor wafer in place during the manufacturing process. Over time, the chucks develop wear from use and their performance degrades.

An exemplary electrostatic chuck will be described with reference to FIGS. 1A-1B and FIGS. 2A-2B.

FIG. 1A shows a plan view of front side 102 of exemplary electrostatic chuck 100. Front side 102 has a mounting ledge 104 and a top surface 106. Top surface 106 is elevated above mounting ledge 104 as seen in FIG. 1B. Mounting ledge 104 is used to mount electrostatic chuck 100 during use. Mounting ledge 104 may have mounting holes (not shown) to secure electrostatic chuck 100 during use. Mounting ledge 104 may also be modified in any other known fashion to secure electrostatic chuck 100 during use.

Top surface 106 comprises a first electrode portion 108 and a second electrode portion 110. First electrode portion 108 is further divided into an outer electrode ring 112 and an inner electrode portion 114. Second electrode portion 110 is a ring of aluminum and is electrically separated from first electrode portion 108 via dielectric epoxy 116. Dielectric epoxy 116 also retains second electrode portion 110 within first electrode portion 108.

In FIG. 1B, the uppermost portion of front side 102 is anodized to prevent unwanted oxidation and provide a dielectric surface of specific thickness between electrostatic chuck 100 and a semiconductor wafer when in use. Outer electrode ring 112 and mounting ledge 104 have associated anodized surface 118, second electrode 110 has associated anodized surface 120, and inner electrode portion 114 has associated anodized surface 122. Also seen in FIG. 1B is access path 126, a way of electrically connecting second electrode portion 110 through first electrode portion 108.

FIG. 2A shows a plan view of back side 200 of electrostatic chuck 100. There are four sections shown on back side 200. Two of these sections are anodized, outer anodized portion 208 and inner anodized portion 210. The other two sections are bare aluminum, outer aluminum portion 206 and inner aluminum portion 204. Before the anodization process, sections 204 and 206 are prevented from being anodized by coating sections 204 and 206 with a masking substance. After the anodization process, the mask is removed. On inner aluminum portion 204 access path 126 can be seen.

In operation, electrostatic chuck 100 uses electrostatic forces to hold a semiconductor wafer to its surface. As shown in FIG. 1B, first electrode portion 108 and second electrode portion 110 are oppositely charged. First electrode portion 108 is positively charged and second electrode portion 110 is negatively charged. This charge is developed by applying a voltage difference between first electrode portion 108 and second electrode portion 110. The charges of the two portions of electrostatic chuck 100 induce an opposite charge in a nearby portion of a semiconductor wafer, which creates an electrostatic attraction between the semiconductor wafer and electrostatic chuck 100.

When processing of the semiconductor wafer is completed, the voltage applied to first electrode portion 108 and second electrode portion 110 may be removed or partially reversed to "dechuck" the wafer. Because of the fragility of the wafer and the precision required in all aspects of the fabrication process, very precise control of the electric fields produced by the electrostatic chuck is required. Accordingly, all parameters of the electrostatic chuck that may affect the electric fields produced, must be maintained within a precise range. Non-limiting examples of these intrinsic characteristics include resistance, inductance, capacitance, and impedance of the electrostatic chuck.

Use of electrostatic chuck 100 over time may degrade its performance. The degradation may occur as a result of surface affects that may develop with use, as shown in FIG. 3. FIG. 3 shows a cross-sectional view of an exemplary electrostatic chuck 300. Electrostatic chuck 300 shows various signs of wear. Electrostatic chuck 300 has front side 302, which comprises mounting ledge 304 and top surface 306. Top surface 306 has first electrode portion 312 and second electrode portion 310. First electrode portion 312 is separated from second electrode portion 310 by a dielectric epoxy 316. The upper portion of top surface 306 has an anodized layer 318 disposed thereon.

Several types of wear may develop on electrostatic chuck 300. Particulate matter 320 and 322 may stick to top surface 306. Scratches or marks 324 and 326 may occur in anodized layer 318. Pits 328 and 330 may also develop in dielectric epoxy layer 316. Deep scratches 332 may occur in top surface 306 such that the scratch penetrates anodized layer 318 and affects first electrode portion 312. Particulate matter 320 and 322 may be removed from the surface of electrostatic chuck 300 by known methods of cleaning, but scratches 324 and 326, pits 328 and 330, and deep scratches 332 require more intensive repair.

When an electrostatic chuck becomes too worn to use, it may be refurbished to repair the wear developed in use. Conventionally, such a process requires separation of the two electrodes 402 and 404 of electrostatic chuck 400 as seen in FIG. 4. By separating electrodes 402 and 404, the entire epoxy layer that separated the two electrodes may be removed and replaced. Disassembly of an electrostatic chuck is very difficult and may cause irreparable damage to the electrostatic chuck. When electrode 404 is removed from the recess in electrode 402, the epoxy left as residue on both electrodes must be fully removed. This removal may damage one or both of electrodes 402 and 404. Also, the epoxy is generally removed by means of scraping, which may damage either or both of electrodes 402 and 404.

Further, improper reassembly after such a refurbishing process is also very likely to compromise the working parameters of an electrostatic chuck. Specifically, when second electrode 404 is placed back in recess 406 in electrostatic chuck 400, it may scratch or be scratched by the edges of recess 406. A point of contact may also be formed between the wall of recess 406 and second electrode 404, causing a failure of the refurbishing process. Also, if the upper surface of second electrode 404 is not flush with the upper surface of first electrode 402, the height mismatch may negatively affect the performance of electrostatic chuck 400 or may even render the resulting device unusable.

During reassembly, a new epoxy layer must be added to electrostatic chuck 400 to separate electrodes 402 and 404. Improper application of this new epoxy layer is very difficult. If there is too little epoxy applied, the upper surface of second electrode 404 will end tip lower than the upper surface of electrode 402, which may negatively affect the performance of electrostatic chuck 400. If there is too much epoxy applied, the upper surface of electrode 404 will end tip higher than the upper surface of electrode 402, which may negatively affect the performance of electrostatic chuck 400. Also if the reassembly is not carefully controlled, air bubbles may form between electrodes 402 and 404 or the epoxy layer and either electrode 402 or electrode 404. These air bubbles may negatively affect the performance of electrostatic chuck 400.

In light of the various potential problems associated with the conventional techniques for refurbishing a bipolar electrostatic chuck discussed above, the typical yield of such techniques is only approximately 30%.

What is needed is a bipolar electrostatic chuck refurbishing process that is less likely to damage the bipolar electrostatic chuck.

What is additionally needed is a bipolar electrostatic chuck refurbishing process that provides a yield greater than 30%.

BRIEF SUMMARY

It is an object of the present invention to provide a bipolar electrostatic chuck refurbishing process that is less likely to damage the bipolar electrostatic chuck.

It is another object of the present invention to provide a bipolar electrostatic chuck refurbishing process that does not require physically separating the two electrodes of the bipolar electrostatic chuck.

It is another object of the present invention to provide a bipolar electrostatic chuck refurbishing process that provides a yield of close to 100%.

One aspect of the present invention is drawn to method of treating a bipolar electrostatic chuck having a front surface and a back surface and comprising a first electrode disposed at the front surface, a second electrode at the front surface and an anodized layer disposed on the front surface, the first electrode and the second electrode. The method comprises measuring a first parameter of the electrostatic chuck, discarding the electrostatic chuck if the first measured parameter is not within a first predetermined range, cleaning the electrostatic chuck if the first measured parameter is within the first predetermined range, sealing gaps between the first electrode and the second electrode at the front surface with a sealant, without displacing the first electrode relative to the second electrode, eliminating the anodized layer; and disposing a new anodized layer onto the front surface, the first electrode and the second electrode. Measuring the first parameter of the electrostatic chuck includes measuring a resistance. Measuring a resistance includes measuring a resistance between the first electrode and the second electrode. Measuring a resistance includes measuring a resistance between the back surface and one of the first electrode and the second electrode. Measuring a resistance between the back surface and one of the first electrode and the second electrode includes measuring a resistance between the back surface and the first electrode. Measuring a resistance between the surface and one of the first electrode and the second electrode includes measuring a resistance between the back surface and the second electrode. Measuring the first parameter of the electrostatic chuck includes measuring a capacitance. Measuring a capacitance includes measuring, a capacitance between the first electrode and the second electrode. Measuring a capacitance includes measuring a capacitance between the back surface and one of the first electrode and the second electrode. Measuring a capacitance between the back surface and one of the first electrode and the second electrode includes measuring a capacitance between the back surface and the first electrode. Measuring a capacitance between the back surface and one of the first electrode and the second electrode includes measuring a capacitance between the back surface and the second electrode. Measuring a first parameter of the electrostatic chuck includes measuring an impedance. Measuring an impedance includes measuring an impedance between the first electrode and the second electrode. Measuring an impedance includes measuring an impedance between the back surface and one of the first electrode and the second electrode. Measuring an impedance between the back surface and one of the first electrode and the second electrode includes measuring an impedance between the back surface and the first electrode. Measuring an impedance between the back surface and one of the first electrode and the second electrode includes measuring an impedance between the back surface and the second electrode.

Additional objects, advantages and novel features of the invention are set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

An exemplary process for refurbishing bipolar electrostatic chucks will be described with reference to FIGS. 1-3 and 5-7. One of the beneficial aspects that differentiate the present invention over conventional bipolar electrostatic chucks refurbishing techniques is that the present invention does not separate the two electrodes in the refurbishing process. Another feature of the following exemplary process is a plurality of quality checks. The quality checks provide a way of greatly increasing the probability of the refurbishing process resulting in a working electrostatic chuck.

Figure 1A:
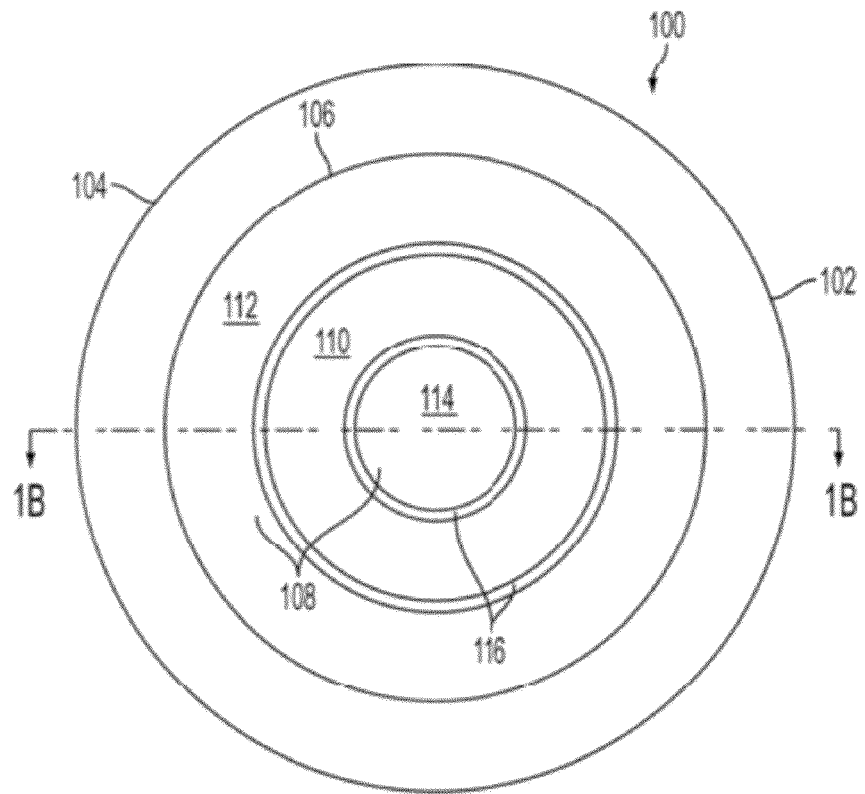
FIG. 1A illustrates a plan view of the front side of an exemplary electrostatic chuck.
Figure 1B:
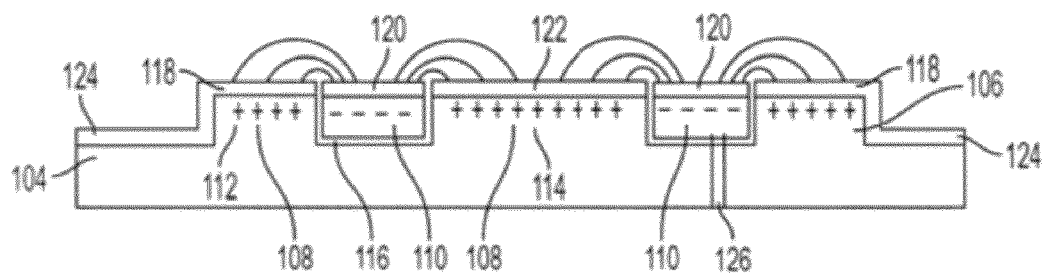
FIG. 1B illustrates a cross-sectional view of the exemplary electrostatic chuck of FIG. 1A along line x-x.
Figure 2A:
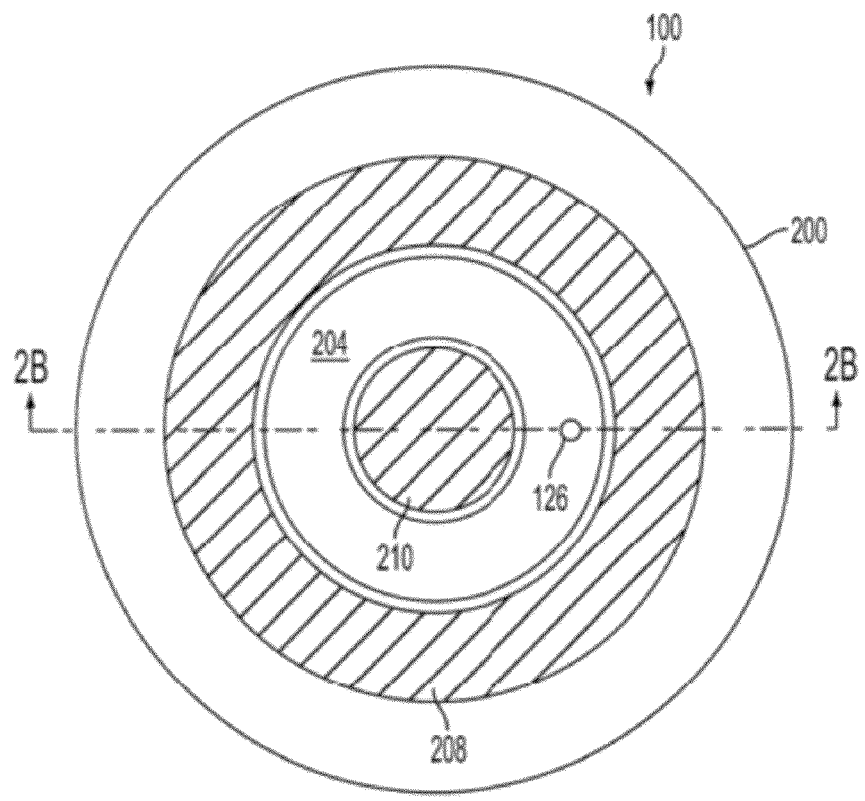
FIG. 2A illustrates a plan view of the back side of an exemplary electrostatic chuck.
Figure 2B:
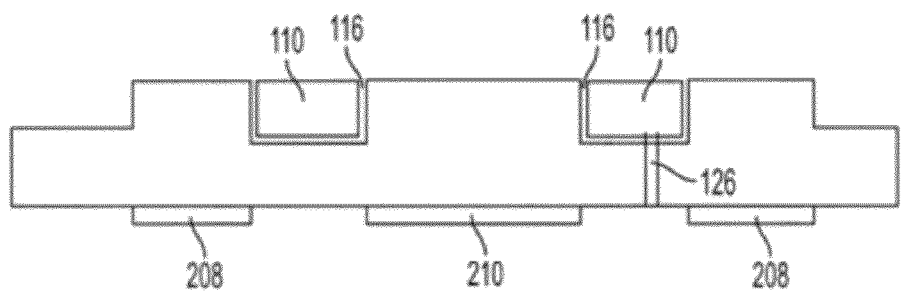
FIG. 2B illustrates a cross-sectional view of the exemplary electrostatic chuck of FIG. 2A along line y-y.
Figure 3:
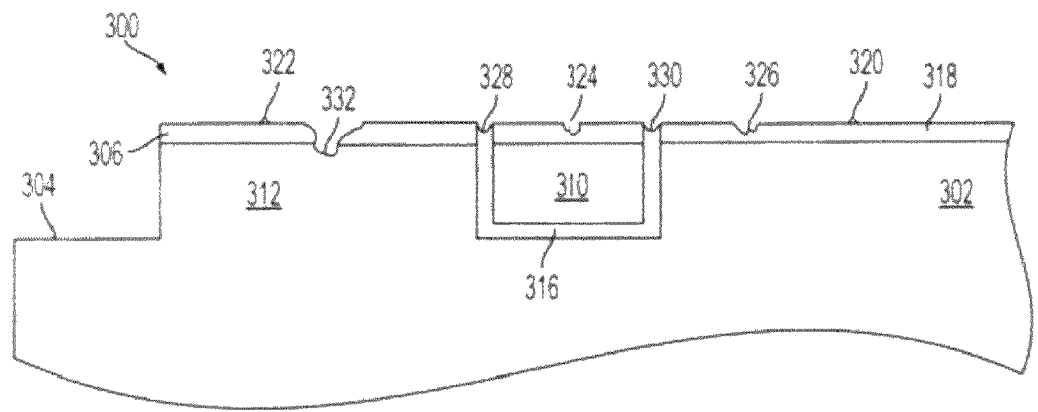
FIG. 3 illustrates a cross-sectional view of a portion of an exemplary electrostatic chuck showing wear from use.
Figure 4:
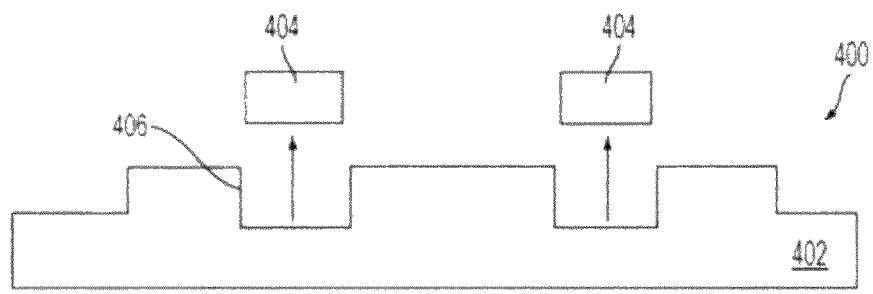
FIG. 4 illustrates a conventional method for refurbishing an exemplary electrostatic chuck.
Figure 5A:
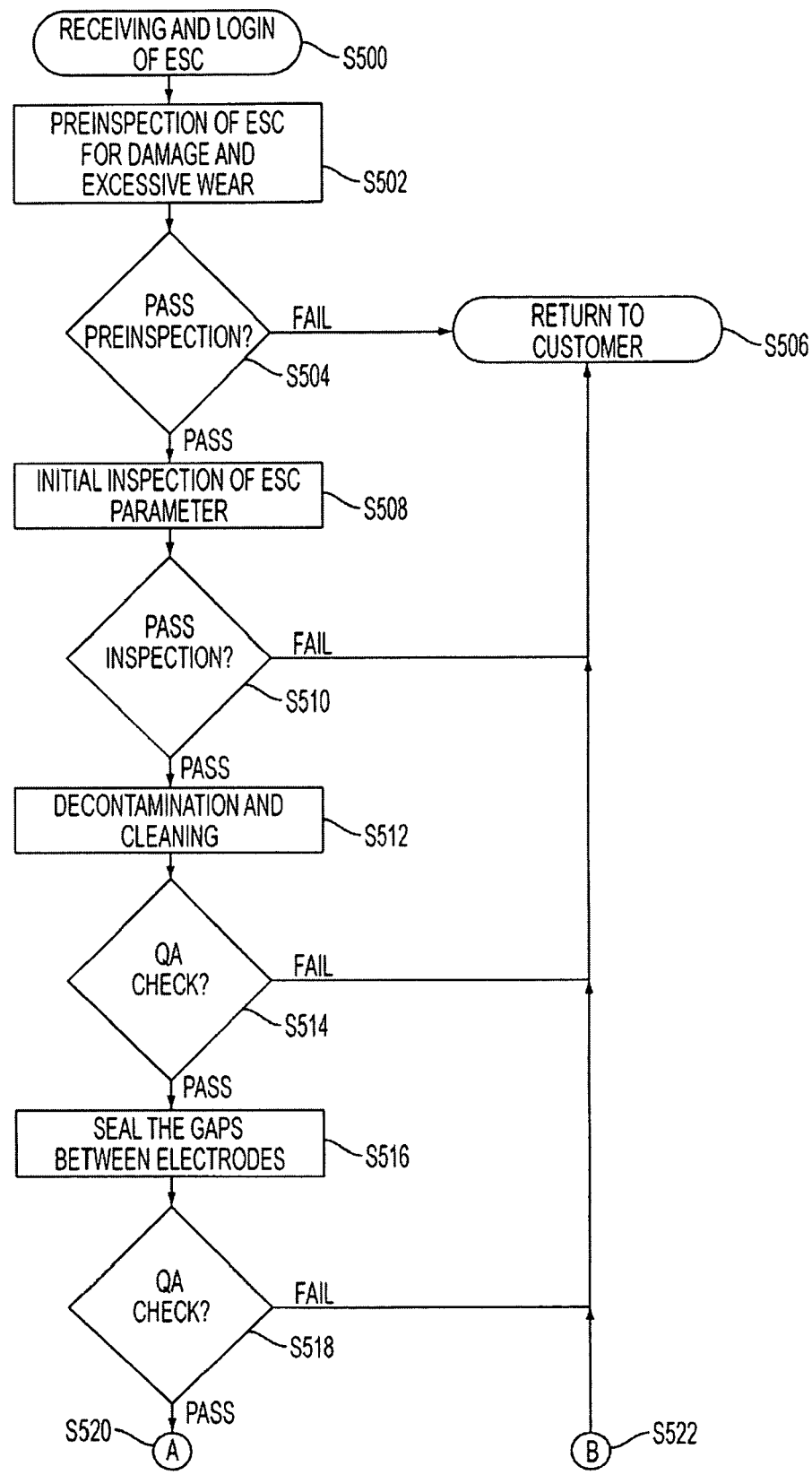
FIGS. 5A-5C illustrate a logic flow diagram detailing an exemplary refurbishing process in accordance with the present invention.
Figure 5B:
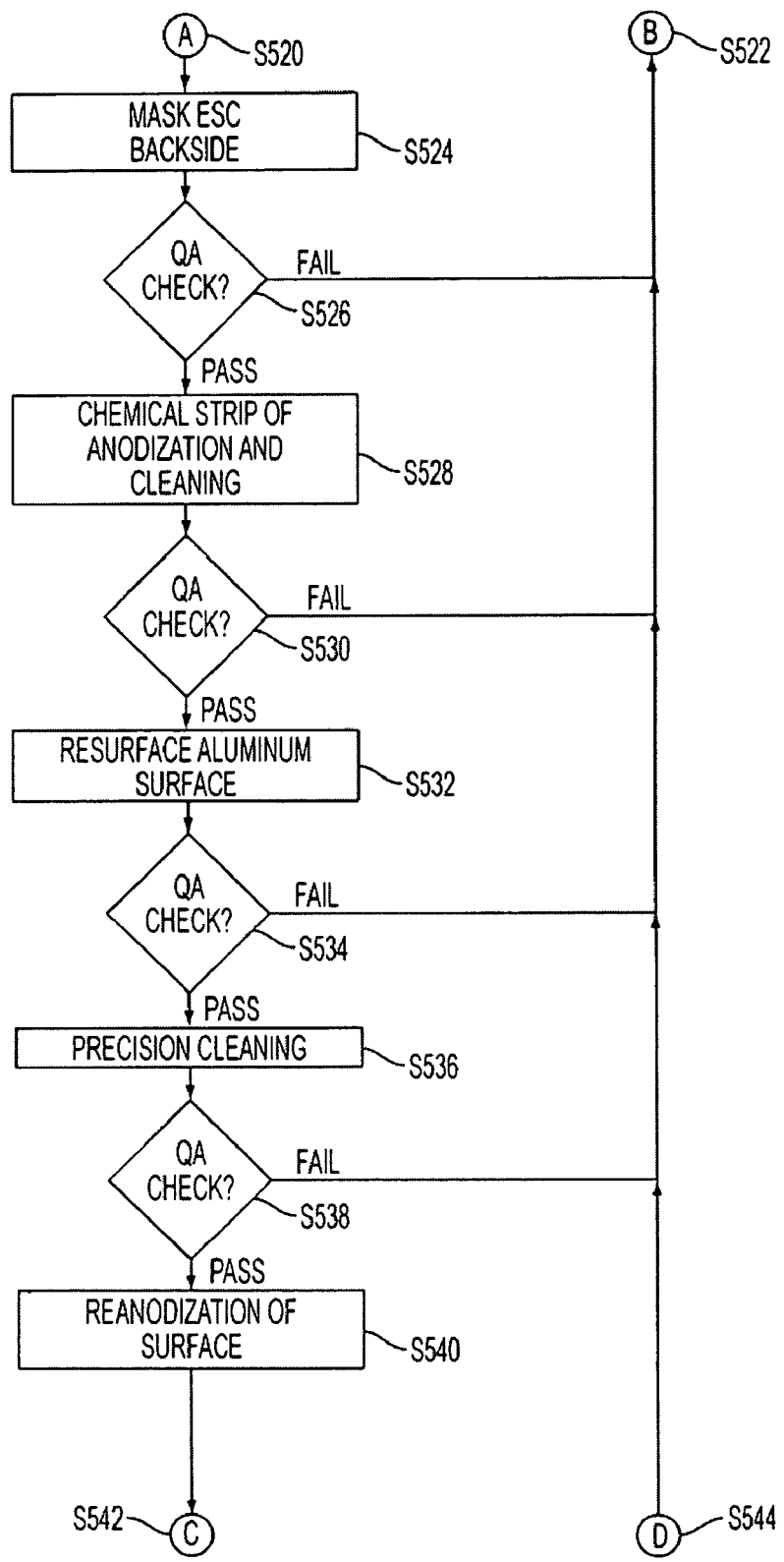

The exemplary process begins with the receiving of electrostatic chuck 100 (S500) as seen in FIG. 5A. Next, electrostatic chuck 100 is given an initial inspection (S502) for physical defects including but not limited to cracks, dents, and deep scratches. One example of such damage would be deep scratch 332 on electrostatic chuck 300 as shown in FIG. 3. Resurfacing the aluminum of electrostatic chuck 300 may not be able to repair such a deep scratch, or similar defect, which would result in a failure of the refurbishing process.

After determining whether chuck 100 passes this pre-inspection (S504), failure may result in returning chuck 100 to the customer (S506) and passing of the pre-inspection may lead to an initial inspection of one or more parameters of electrostatic chuck 100 (S508). Parameters that may be measured include, but are not limited to, resistance, capacitance, inductance, and impedance. These measurements may be measured between front side 102 and back side 200 of electrostatic chuck 100, first electrode 108 and second electrode 110, or any other set of points on electrostatic chuck 100. The measured values for these parameters must be within a predetermined acceptable range. If the value is much higher or much lower, it may indicate the presence of various types of defects in electrostatic chuck 100 that cannot be repaired by the refurbishing process, including but not limited to a short circuit between first electrode 108 and second electrode 110.

The measured values for the parameters of electrostatic chuck 100 are compared to a known baseline value, said value being known to be an acceptable for the parameter measured. The known baseline value may be obtained, for example, from manufacturer specifications or taking electrostatic chucks, known to be acceptable in performance, and measuring the parameter. A further method measures values the parameter using a plurality of electrostatic chucks, for example 100, to create a range of data for comparison. This range of data may be used to create a bell curve of values and the acceptable value range obtained via this method would be values that fall within a specified number of standard deviations from the mean.

After determining whether chuck 100 passes this inspection (S510), failure may result in returning chuck 100 to the customer (S506) and passing may lead to decontamination and cleaning (S512). Any known method of decontamination and cleaning may be used. In one exemplary embodiment, this procedure includes wiping with and soaking in isopropyl alcohol, an ultrasonic cleaning, and an oven baking. This cleaning process removes dirt particles such as particles 320 and 322 as shown in FIG. 3. If dirt particles 320 and 322 were not cleaned off, they may affect at least one of the physical parameters of electrostatic chuck 100, including but not limited to resistance, capacitance, inductance, and impedance. Particles 320 and 322 may also interfere with other steps of the refurbishing process including reanodization of the surface (S540).

Following step S512, electrostatic chuck 100 may be given a quality check (S514). This quality check (S514) may measure a value of a parameter of electrostatic chuck 100, as discussed above. Failure of quality check (S514) may result in returning chuck 100 to the customer (S506) and passing the check may lead to the next step of scaling the gaps between electrodes (S516).

Figure 6:
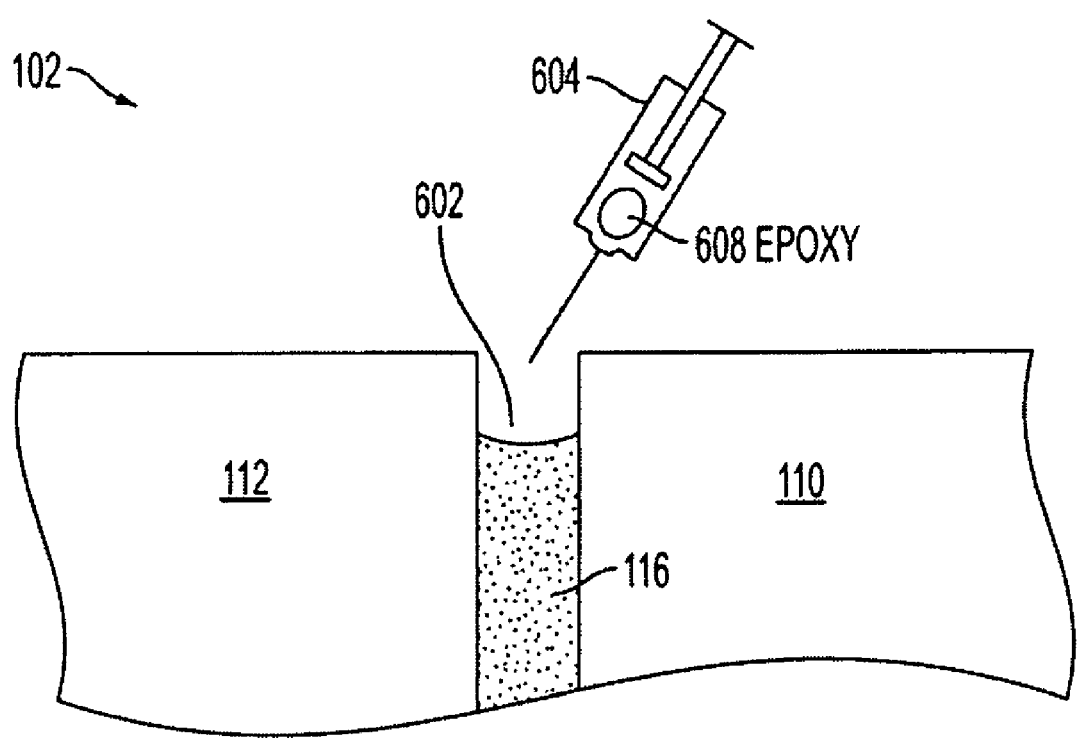
FIG. 6 illustrates an exemplary method for sealing gaps between electrodes.

As discussed previously, gaps in the sealant between electrodes of an electrostatic chuck may occur from use. A portion of front side 102 of an exemplary electrostatic chuck 100 is shown in FIG. 6. Outer electrode ring 112 and second electrode portion 110 are electrically separated by dielectric epoxy 116, a portion of which has worn down over time to create gap 602. Contrary to conventional techniques, the present invention does not separate the electrodes 108 and 110 of electrostatic chuck 100 to repair damage to front side 102. Therefore, the present invention does not risk further damage to electrostatic chuck 100 that may be caused by disassembling and reassembling the electrostatic chuck. In one exemplary embodiment of the present invention, a microscope is used by a worker to guide syringe 604 into gap 602. Syringe 604 is filled with epoxy 608 which is used to rill gap 602. Other known methods may be used to seal gap 602 in other embodiments, including but not limited to an automated system. As discussed above, in accordance with the present invention, electrodes 108 and 110 are not separated to repair damage to electrostatic chuck 100. As a result, the present invention does not risk damage to electrodes 108 and 110 that may arise due to disassembly and reassembly of electrostatic chuck 100.

Returning to FIG. 5A and following step S516, electrostatic chuck 100 may be given a quality check (S518). This quality check (S518) may measure a value of a parameter of electrostatic chuck 100, as discussed above. Failure of quality check (S518) may result in returning chuck 100 to the customer (S506) and passing the check may lead to masking of back side 200 of electrostatic chuck 100 (S524) as continued in FIG. 5B along point A.

Returning to FIG. 2A, bare aluminum sections 204 and 206 are coated with a known masking substance. Anodized sections 208 and 210 are not coated with the masking substance and will therefore be subjected to the following processes that etch and anodize any unmasked surfaces of electrostatic chuck 100.

Following step S524, electrostatic chuck 100 may be given a quality check (S526). Passing the check may lead to chemical stripping and cleaning of electrostatic chuck 100 (S528). This quality check (S526) may measure a value of a parameter of electrostatic chuck 100, as discussed above. Failure of quality check (S526) may result in returning chuck 100 to the customer (S506) by returning to FIG. 5A along point B.

Figure 7:
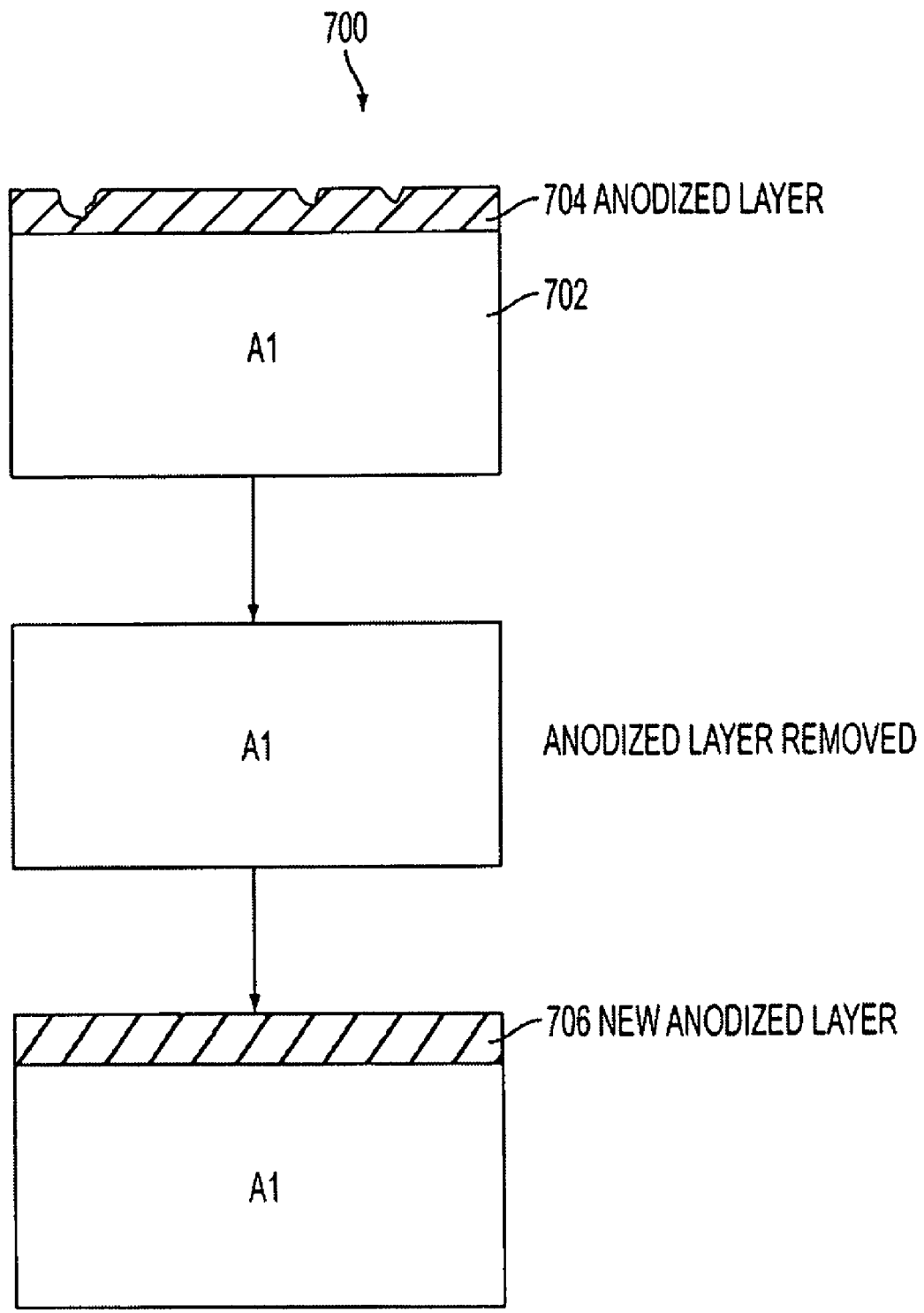
FIG. 7 illustrates an exemplary process for removal of the anodized surface and reanodization of an exemplary electrostatic chuck.

FIG. 7 shows a blown-up cross-sectional portion of electrostatic chuck 100. Section 700 shows a thin anodized layer 704 over an aluminum base 702. Anodized layer 704 shows some damage or wear. Any known method may be used to strip the anodized surface from the raw aluminum. Once the anodized layer has been removed, the surface is cleaned using any known cleaning method.

Returning to FIG. 5B and following step S528, electrostatic chuck 100 may be given a quality check (S530). This quality check (S530) may measure a value of a parameter of electrostatic chuck 100, as discussed above. Failure of quality check (S530) may result in returning chuck 100 to the customer (S506) and passing the check may lead to resurfacing of the bare aluminum (S532). This resurfacing will allow for a more even and controlled reanodization of the surface.

Following step S532, electrostatic chuck 100 may be given a quality check (S534). This quality check (S534) may measure a value of a parameter of electrostatic chuck 100, as discussed above. Failure of quality check (S534) may result in returning chuck 100 to the customer (S506) and passing the check may lead to a precision cleaning of electrostatic chuck 100 (S536). Any known non-destructive method may be used to clean the surface.

Following step S536, electrostatic chuck 100 may be given a quality check (S538). This quality check (S538) may measure a value of a parameter of electrostatic chuck 100, as discussed above. Failure of quality check (S538) may result in returning chuck 100 to the customer (S506) and passing the check may lead to anodization of the aluminum surface to develop a new anodized layer (S540). This process is carefully monitored to obtain a precise predetermined thickness of new anodized layer 706 atop aluminum 702. New anodized layer 706 returns the original operational parameters of electrostatic chuck 100.

Figure 5C:
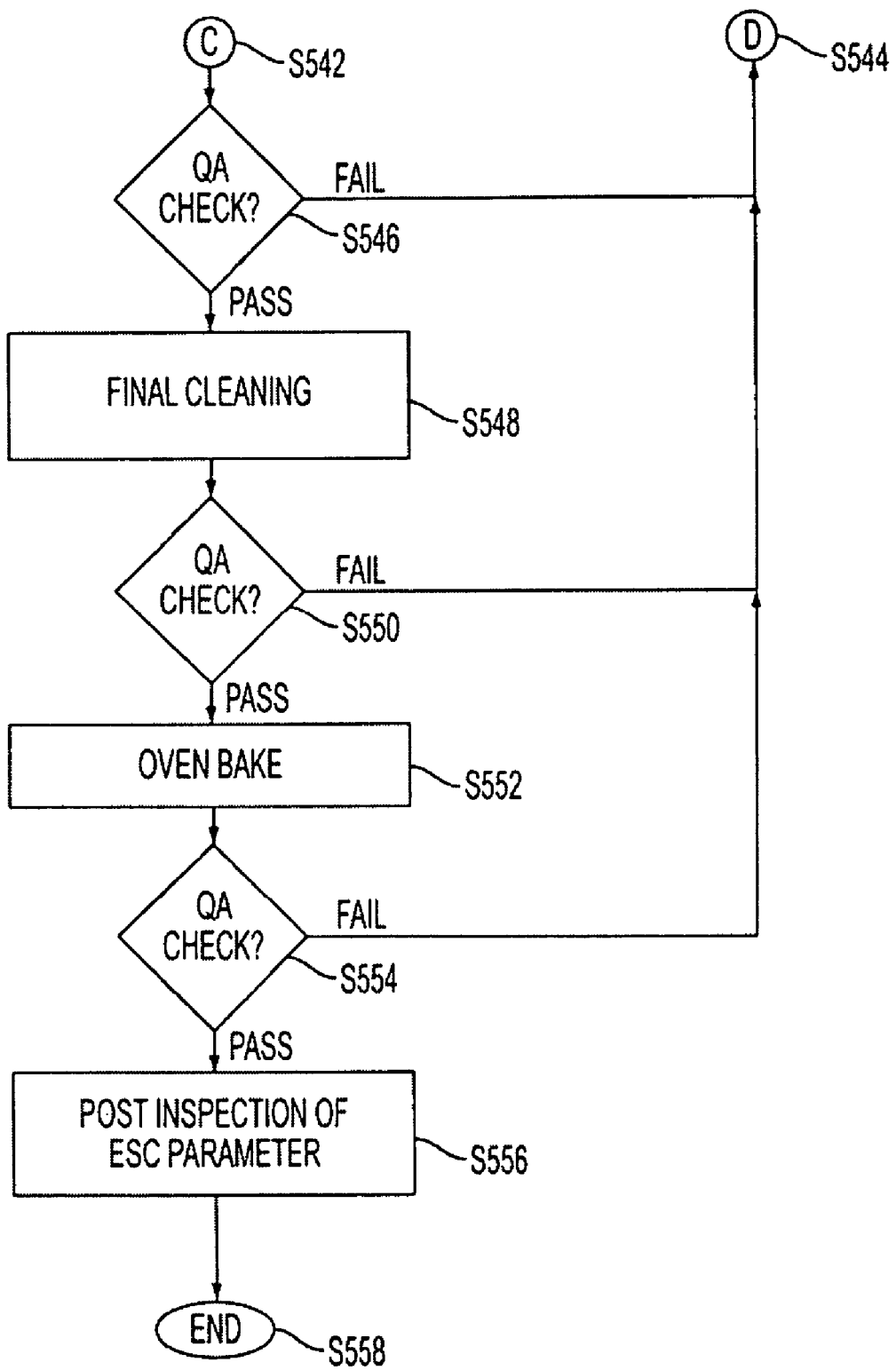

Returning to FIG. 5B and following step S540, electrostatic chuck 100 may be given a quality check (S546) following point C into FIG. 5C. This quality check (S546) may measure a value of a parameter of electrostatic chuck 100, as discussed above. Failure of quality check (S546) may result in returning chuck 100 to the customer (S506) and passing the check may lead to a final cleaning of electrostatic chuck 100 (S548). The cleaning is accomplished by any known method, non-limiting examples of which include ultrasonic cleaning.

After step S548, electrostatic chuck 100 may be given a quality check (S550). This quality check (S550) may measure a value of a parameter of electrostatic chuck 100, as discussed above. Failure of quality check (S550) may result in returning chuck 100 to the customer (S506) following point D into FIG. 5B. Passing the check may lead to an oven bake (S552) to evaporate any moisture remaining from the cleaning process.

Following step S552, electrostatic chuck 100 may be given a quality check (S554). This quality check (S554) may measure a value of a parameter of electrostatic chuck 100, as discussed above.

Failure of quality check (S554) may result in returning chuck 100 to the customer (S506) and passing the check may lead to a post-inspection of one or more additional parameters of electrostatic chuck 100 (S556). Parameters that may be measured include, but are not limited to, resistance, capacitance, inductance, and impedance. These measurements may be measured between front side 102 and back side 200 of electrostatic chuck 100, first electrode 108 and second electrode 110, or any other set of points on electrostatic chuck 100. The measured values for these parameters must be within a predetermined acceptable range, else electrostatic chuck 100 has failed the refurbishing process.

After the post-inspection (S556), electrostatic chuck 100 has finished the refurbishing process (S558) and may be packaged and resold.

The refurbishing-process described above includes a plurality of quality checks. Each quality check is based on at least one parameter of electrostatic chuck 100. The parameter is compared to a predetermined value known from manufacturer specifications or known from previous measurements of electrostatic chucks known to be acceptable in their performance after undergoing the refurbishing process. These quality checks are performed without disassembly of electrostatic chuck 100.

During the refurbishing process described above, electrode 108 is not separated from electrode 110 for repair. Therefore, the refurbishing process does not risk damage to electrodes 108 and 110 as a result of disassembly or reassembly of electrostatic chuck 100 during the refurbishing process. Further, methods in accordance with the present invention provide close to 100% yield of acceptable refurbished bipolar electrostatic chucks because the processes outlined of cleaning the electrostatic chuck if the first measured parameter is within the first predetermined range; sealing gaps between the first electrode and the second electrode at the front surface with a sealant, without displacing the first electrode relative to the second electrode; eliminating the anodized layer; and disposing a new anodized layer onto the front surface, the first electrode and the second electrode have proven to return electrostatic chucks to their original form almost 100% of the time. The only times that electrostatic chucks are not returned to their original form are those when the quality checks fail.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The exemplary embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A method of treating a bipolar electrostatic chuck having a front surface and a back surface and comprising a first electrode disposed at the front surface, a second electrode at the front surface and an anodized layer disposed on the front surface, the first electrode and the second electrode, said method comprising:
    measuring a first parameter of the electrostatic chuck;
    discarding the electrostatic chuck if the first measured parameter is not within a first predetermined range;
    cleaning the electrostatic chuck if the first measured parameter is within the first predetermined range;
    sealing gaps between the first electrode and the second electrode at the front surface with a sealant, without displacing the first electrode relative to the second electrode;
    eliminating the anodized layer; and
    disposing a new anodized layer onto the front surface, the first electrode and the second electrode.

2. The method of claim 1, wherein said measuring a first parameter of the electrostatic chuck comprises measuring a resistance.

3. The method of claim 2, wherein said measuring a resistance comprises measuring a resistance between the first electrode and the second electrode.

4. The method of claim 2, wherein said measuring a resistance comprises measuring a resistance between the back surface and one of the first electrode and the second electrode.

5. The method of claim 4, wherein said measuring a resistance between the back surface and one of the first electrode and the second electrode comprises measuring a resistance between the back surface and the first electrode.

6. The method of claim 4, wherein said measuring a resistance between the surface and one of the first electrode and the second electrode comprises measuring a resistance between the back surface and the second electrode.

7. The method of claim 1, wherein said measuring a first parameter of the electrostatic chuck comprises measuring a capacitance.

8. The method of claim 7, wherein said measuring a capacitance comprises measuring a capacitance between the first electrode and the second electrode.

9. The method of claim 7, wherein said measuring a capacitance comprises measuring a capacitance between the back surface and one of the first electrode and the second electrode.

10. The method of claim 9, wherein said measuring a capacitance between the back surface and one of the first electrode and the second electrode comprises measuring a capacitance between the back surface and the first electrode.

11. The method of claim 9, wherein said measuring a capacitance between the back surface and one of the first electrode and the second electrode comprises measuring a capacitance between the back surface and the second electrode.

12. The method of claim 1, wherein said measuring a first parameter of the electrostatic chuck comprises measuring an impedance.

13. The method of claim 12, wherein said measuring an impedance comprises measuring an impedance between the first electrode and the second electrode.

14. The method of claim 12, wherein said measuring an impedance comprises measuring an impedance between the back surface and one of the first electrode and the second electrode.

15. The method of claim 14, wherein said measuring an impedance between the back surface and one of the first electrode and the second electrode comprises measuring an impedance between the back surface and the first electrode.

16. The method of claim 14, wherein said measuring an impedance between the back surface and one of the first electrode and the second electrode comprises measuring an impedance between the back surface and the second electrode.

17. The method of claim 1, further comprising measuring a second parameter of the electrostatic chuck after completion of at least one of said cleaning, said sealing, said eliminating and said providing.

18. The method of claim 17, wherein the second parameter comprises the first parameter.

19. The method of claim 17, further comprising discarding the electrostatic chuck if the second measured parameter is not within a second predetermined range.

* * * * *